(12) United States Patent
Worrall et al.

(10) Patent No.: US 10,197,623 B2
(45) Date of Patent: Feb. 5, 2019

(54) HEATABLE INTERPOSER FOR TEMPERATURE-CONTROLLED TESTING OF SEMICONDUCTOR DEVICES

(71) Applicant: Texas Instruments Incorporated, Dallas, TX (US)

(72) Inventors: Marshall Ryan Worrall, Dallas, TX (US); David Casimir Garges, Union City, CA (US); Xu Gao, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 17 days.

(21) Appl. No.: 15/265,991

(22) Filed: Sep. 15, 2016

(65) Prior Publication Data
US 2018/0074118 A1    Mar. 15, 2018

(51) Int. Cl.
*G01R 31/00* (2006.01)
*G01R 31/28* (2006.01)
(Continued)

(52) U.S. Cl.
CPC ..... *G01R 31/2891* (2013.01); *G01R 1/07378* (2013.01); *H01L 23/345* (2013.01);
(Continued)

(58) Field of Classification Search
CPC ..... H01L 2224/73204; H01L 2924/181; H01L 2224/16227; H01L 2224/81; H01L 23/49822; H01L 24/17; H01L 24/75; H01L 24/81; H01L 24/97; H01L 2224/11334; H01L 2224/1703; H01L 2224/17134; H01L 2224/171; H01L 2224/75754; H01L 2224/81035; H01L 2224/81895; H01L 2224/81896; H01L 23/28; H01L 23/3107; H01L 23/3114; H01L 23/5383; H01L 23/5389; H01L 24/05; H01L 24/14; H01L 2021/60022; H01L 21/481; H01L 2224/81193; H01L 2224/83192; H01L 2225/06517; H01L 2225/06541; H01L 2225/06551; H01L 2224/13017; H01L 2224/14051; H01L 2224/4903; H01L 2224/73104; H01L 2224/73207;
(Continued)

(56) References Cited

U.S. PATENT DOCUMENTS

| 5,597,643 | A  | * | 1/1997  | Weber  | H01L 21/4857 174/255 |
| 2008/0296697 | A1 | * | 12/2008 | Hsu    | H01L 23/49827 257/379 |
| 2013/0016477 | A1 | * | 1/2013  | Yokoya | H01L 23/36 361/719 |

* cited by examiner

*Primary Examiner* — Vinh Nguyen
(74) *Attorney, Agent, or Firm* — Ronald O. Neerings; Charles A. Brill; Frank D. Cimino

(57) ABSTRACT

A contactor having the top ends of its pogo pins contacting the leads of a semiconductor device package positioned in a handler at controlled temperature, and the bottom ends of the pogo pins contacting the pads of electrically conducting vias extending vertically through a heatable interposer. The heatable interposer has a first and a second surface and includes alternating horizontal layers of thermally conductive material and thermally insulating material, and further one or more heating layers operable to control a temperature profile from the first to the second surface, including a temperature control at the first surface. The via pads at the second interposer surface are in contact with the printed circuit board of a tester.

38 Claims, 2 Drawing Sheets

(51) Int. Cl.
*H01L 23/498* (2006.01)
*H01L 23/34* (2006.01)
*H05K 1/02* (2006.01)
*G01R 1/073* (2006.01)

(52) U.S. Cl.
CPC .. *H01L 23/49811* (2013.01); *H01L 23/49827* (2013.01); *H01L 23/49838* (2013.01); *H05K 1/0212* (2013.01); *G01R 31/2889* (2013.01); *H05K 2201/10151* (2013.01); *H05K 2201/10378* (2013.01)

(58) Field of Classification Search
CPC .......... H01L 2224/73265; H01L 2224/75703; G01R 1/07378; G01R 1/06711; G01R 1/06772; G01R 1/0735; G01R 31/2637; G01R 31/2874; G01R 31/2891; G01R 35/00; G01R 3/00; H01M 10/613; H04B 1/036

See application file for complete search history.

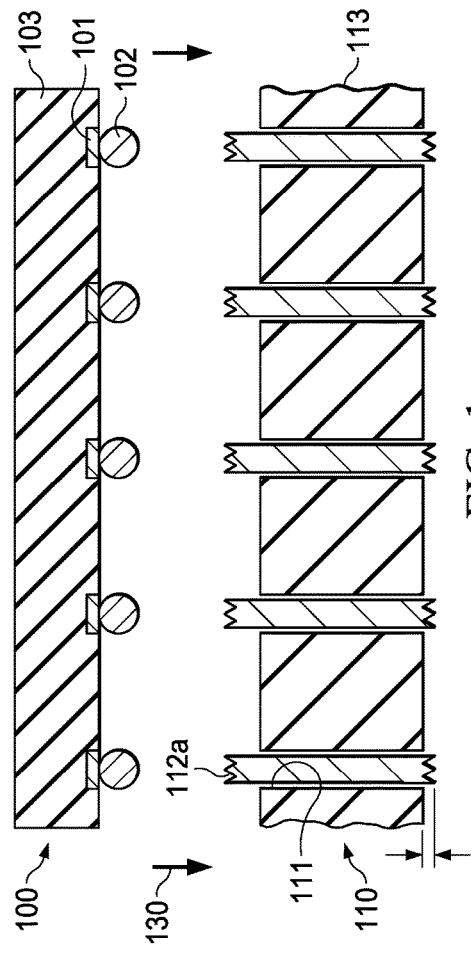
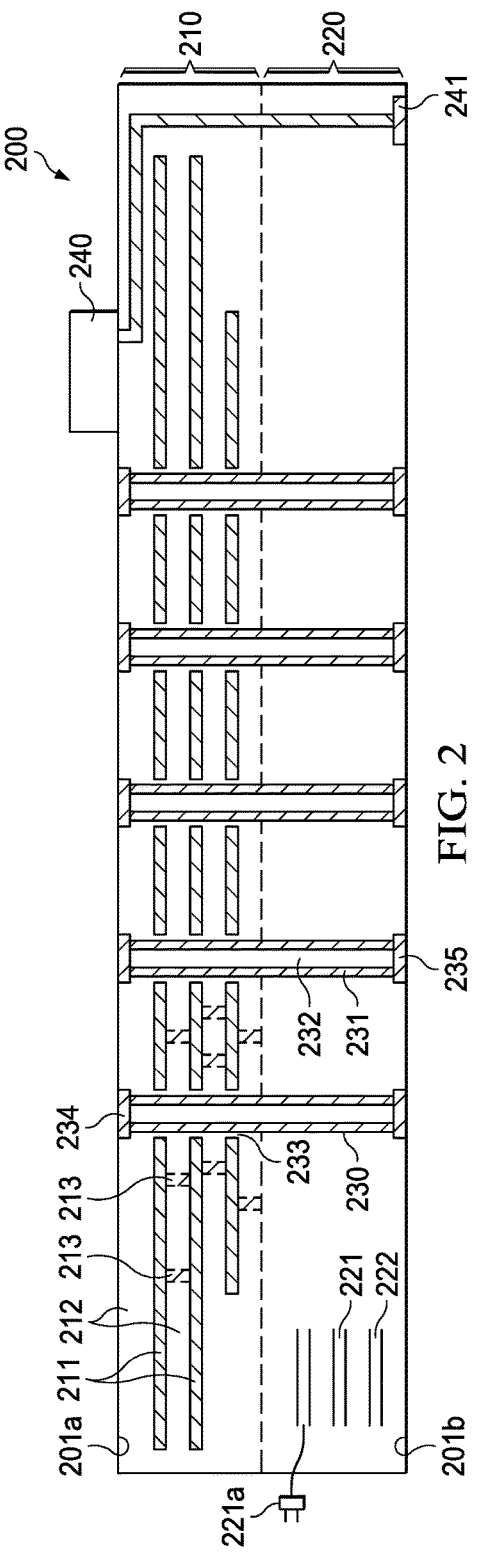

HEATABLE INTERPOSER FOR TEMPERATURE-CONTROLLED TESTING OF SEMICONDUCTOR DEVICES

FIELD

Embodiments of the present disclosure are related in general to the field of semiconductor devices and processes, and more specifically to structures and method for testing semiconductor devices at controlled temperature by using a heatable interposer in the testing setup.

DESCRIPTION OF RELATED ART

For testing a packaged semiconductor device, the leads of the package are conventionally fortified with easily contactable metallic contacts such as solder-coated leads or solder balls. These fortified leads are brought into contact with the pogo pins of a pin block or a contactor. A mechanical force is needed to actualize the contact. The contacted lead can then be subjected to high-speed AC tests with power dissipation. The tests may be time consuming and thus expensive. For full pin count (FPC) devices, the number of leads may be as many as several hundreds, or even beyond one thousand. The high number of leads is typically arranged in an orderly pattern of rows and lines with equal spacing between the leads. For reduced pin count (RPC) devices, it is economical to exclude the redundant leads and pins from the testing process, since only a subset of the test may be required.

For many applications and for reliability tests, semiconductor devices have to be tested at temperatures different from the temperature of the pogo pins in the sockets of a contactor. To this end, the device-to-be-tested is positioned in a handler set to the test temperature, and the pogo pins are brought into contact with the device terminals. It has been frequently observed, however, that thermal energy may get lost, or get added, along the pogo pins in the contactor, causing temperature shifts and inaccuracies during the test.

The situation when a device package is at a different temperature than the test socket it is tested in, is generally referred to as heat sinking effect. A number of corrective actions are being practiced in semiconductor technology to correct the heat sinking effect and to stabilize the temperature. In one effort, air of preset temperature is blown across the contactor. The response time, however, has often been considered as too long. In another effort known as active thermal control, a heating manipulator is brought near the device package. The cost of the manipulator and its dependence on the size of the package has frequently been considered unsatisfactory. In yet another effort, an additional heater has been inserted into the printed circuit board (PCB) of the tester. This effort has experienced problems with board space and board reliability.

SUMMARY

Applicants realized that a heat sinking effect can be avoided when the temperature of the bottom end of the pogo pins is controlled and sensed. With the actual temperature at the end point of the pogo pins controlled and known, the test results of the tester can be unambiguously correlated to that temperature. Applicants solved the problem of certifying the temperature on the bottom end of the pogo pins when the discovered a method of using a heatable interposer to be inserted between the bottom end of the pogo pins and the entry terminals of the tester.

In an embodiment of the disclosure, the heatable interposer has a shape like a board with a first and a parallel second surface. The interposer includes two parts. The first part has alternating horizontal layers of thermally conductive material to equalize temperature throughout the layers' extent, and of thermally insulating material. The second part consists of one or more heating layers. The interposer further has electrically conductive vias extending vertically through the interposer from the first to the second surface; the ends of the vias are suitable as contact pads for external metallic objects. In conjunction with a temperature sensor, the second portion of the interposer is operable to control a temperature profile along the vias from the first to the second surface; this profile includes a control of the temperature of the via ends exposed at the first surface.

Another embodiment of the disclosure is a test station for packaged semiconductor devices, wherein the package has metallic leads. The device is in a handler, which is operable at controlled temperature. The test station further includes a contactor, which has a pin block with sockets containing pogo pins. The top ends of the pogo pins contact respective metallic leads of the device package, and the bottom ends of the pogo pins protrude from the pin block.

The test station further includes a horizontal interposer with a first surface and a second surface and conductive vias extending vertically between the first surface and the second surface. The via ends at the first surface are contacted by bottom ends of respective pogo pins, the via ends at the second surface are contacted by metallic pads of the printed circuit board (PCB) tied (preferably by solder) to the tester. The interposer is heatable as described above and controls a stable and known temperature at the via ends at the first interposer surface.

BRIEF DESCRIPTION OF THE DRAWINGS

FIG. 1 shows a cross section of a semiconductor device package aligned with a corresponding contactor pin block; both leads and pins exhibit full pin count.

FIG. 2 illustrates a heatable interposer according to the disclosure.

DETAILED DESCRIPTION OF THE PREFERRED EMBODIMENTS

Figure 3:
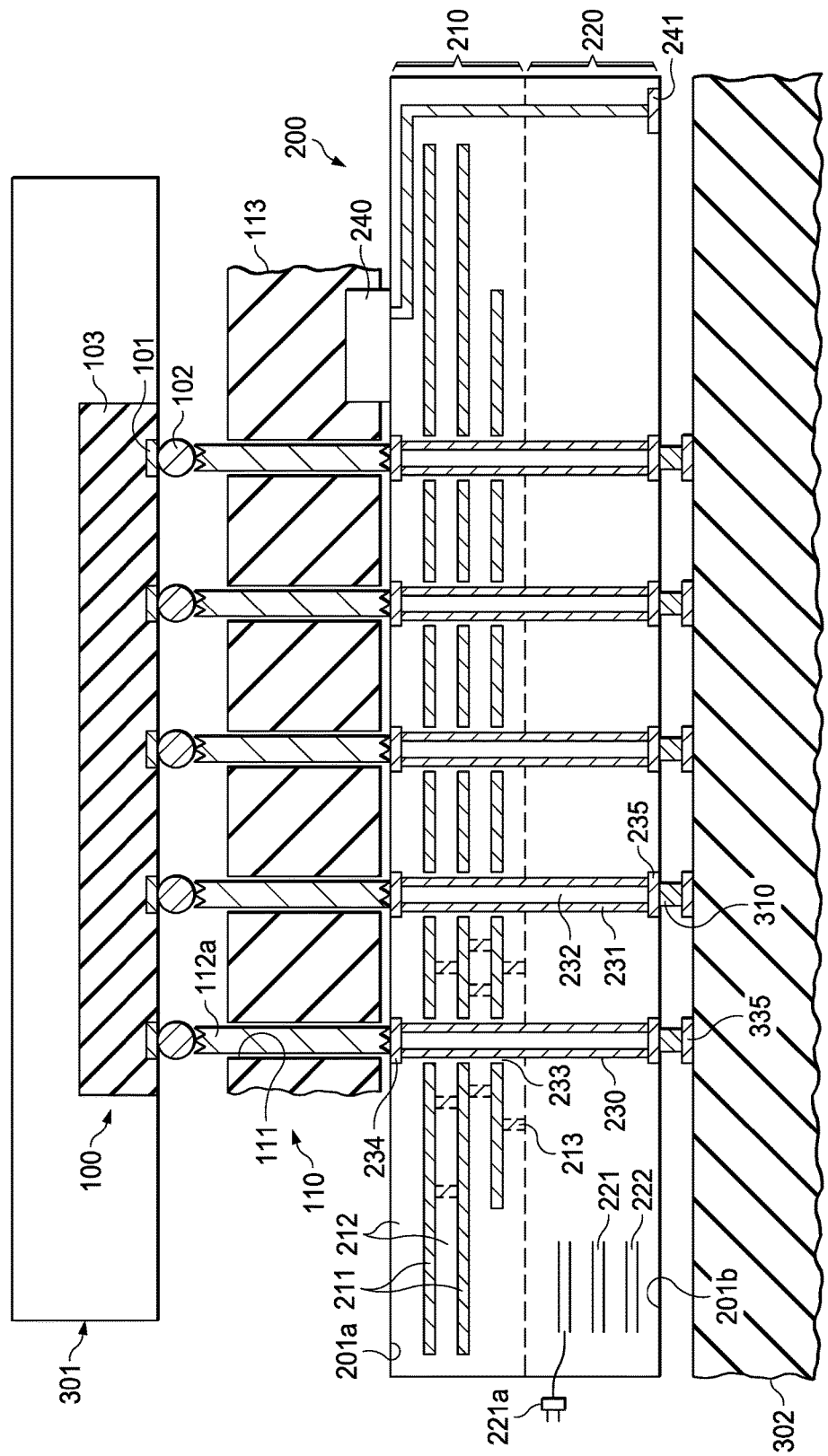
FIG. 3 depicts a station for temperature-controlled testing of semiconductor devices using a heatable interposer between contactor and printed circuit board of tester according to the disclosure.

An embodiment of the disclosure concerns a heatable interposer, which is inserted between the contactor pin block and the tester of a packaged semiconductor device. FIG. 1 illustrates a cross section of an exemplary package 100 of a semiconductor device, which includes a set of metallic leads 101 for electrical contacts to external conductive circuit elements or test pins (pogo pins) of a contactor. The exemplary package may be constructed of a polymeric material 103 such as the polymerized epoxy-based molding compound of plastic packages. In the exemplary package 100, leads 101 may be uniformly distributed in an array of rows and columns. Such semiconductor packages are used, for instance, in semiconductor ball grid array (BGA) devices, pin grid array devices, leadless grid array (LGA) devices, and QFN (Quad Flat No-Lead) devices. Other semiconductor packages may be configured with cantilevered leads, preferably solder-wettable leads.

The flat leads of the exemplary device of FIG. 1 include facilitators for reliable electrical contact, and these facilitators can be solder balls 102. Balls or bumps made of solder offer the advantage of being pliable enough to form reliable contacts to the small teeth or cogs, which are commonly configured on the crown tip of pogo pins. In FIG. 1, each lead 101 is populated by a solder ball 102.

FIG. 1 shows a contactor pin block 110 designed for testing device package 100. Pin block 110 may be made of an insulating material 113 such as hardened plastic. The contactor pin block may include a plurality of sockets 111 in positions matching the set of leads 101 arrayed in rows and columns. Consequently, contactor sockets 111 match with respective leads 101 on a one-to-one basis.

Sockets 111 are designed as cavities to hold test pins (pogo pins) 112 tightly in a vertical position. The pogo pins 112 of FIG. 1 are shaped as elongated cylinders made, for instance, of hardened metal such as stainless steel, palladium alloy, or metal plated with nickel, palladium, or gold. The pogo pins 112 may have a length of about 3 mm and a diameter of approximately 0.3 mm. On both ends, pogo pins 112 are configured to have crown tips with small teeth or cogs 112a for providing reliable electrical contact to leads 101, solder balls 102, or metallic pads. The number of teeth or points 112a for some pogo pins 112 may vary from 3 to 6. It is convenient that on each end, a pogo pin may protrude a short length for easy contact with a lead or a pad. In FIG. 1, the protrusion at the bottom end of the pogo pin 112 is designated 112b. As FIG. 1 shows, each socket 111 is populated by a pogo pin 112, indicating that each pogo pin is available to, and involved in, testing the respective lead 101 or solder ball 102 of device package 100.

In order to initiate the testing process, packaged device 100 is aligned with contactor pin block 110; thereafter, packaged device 100 is moved to bring it in contact with the pogo pins of pin block 110. The movement of device 100 is indicated by arrows 130 in FIG. 1. A mechanical force is applied to assure reliable electrical contact.

FIG. 2 depicts an exemplary embodiment of the disclosure, a heatable interposer generally designated 200. In its overall shape, the interposer resembles a board with a first horizontal surface 201a and a parallel second surface 201b. The interposer comprises a first part 210 and a second part 220.

The first part 210 includes alternating horizontal layers of thermally conductive material (211) and thermally insulating material (212). FIG. 2 illustrates a plurality of thermally conductive layers designated 211. These horizontal layers are selected from materials of high thermal conductivity, which are suitable to equalize temperature throughout the volume of the interposer. As examples, layers 211 may be selected from a group of metals including copper, silver, aluminum, gold, zinc, tungsten, molybdenum, and alloys thereof. Alternatively, the layers may be made of configurations and derivatives of carbon, such as carbon nanotubes and graphene.

As FIG. 2 indicates, horizontal layers 211 may have a plurality of thermally conductive vertical interconnections 213 extending from one horizontal layer 211 of thermally conductive material to the adjacent horizontal layers of thermally conductive material. While FIG. 2 depicts only a few of the interconnections 213 however, interposer 200 may have a large number of interconnections, or, alternatively, may have no interconnections.

It is the purpose of the thermally conductive horizontal layers 211 and the optional vertical interconnections 213 to create and maintain a uniform distribution of temperature throughout portion 210, in particular a uniform temperature at the first surface 201a. The number of horizontal layers 211 of thermally conductive material is selected to counteract any involuntary temperature gradient in the first part of the interposer.

The second part 220 of the interposer includes one or more controlled heating layers 221, separated by insulating layers 222. Heating layers 221 are controlled by external power and ground supply, indicated by electrical plug 221a. The heating layers are structured so that the laminated layers of the first and second parts represent the temperature gradient in the interposer between the test socket 110 and the PCB 302. The gradient control is achieved by having some heating layers more heatable than others. Preferably the heating layers 221 are positioned parallel to thermally conductive layers 211 and to the interposer surfaces 201a and 201b. Alternatively, they may be arranged in any customized manner allowing an approximately uniform heating configuration.

It is preferred that thermocouples are used in a number of places to control and fine-tune the temperature of the profile in the interposer.

FIG. 2 shows that interposer 200 may include vias 230 extending vertically through the interposer from the first surface 201a to the second surface 201b. As an example, vias 230 may have an electrically conductive core. In another example depicted by the interposer of FIG. 2, vias 230 exhibit electrically conductive sidewalls 231 surrounding an empty core 232; such vias may be actualized by drilling holes into the insulating material of the interposer and then depositing a metal layer around the sidewalls. In either realization, the electrically conductive core of the vias is insulated from the thermally conductive horizontal layers 211. The insulation is designated 233 in FIG. 2 and sometimes referred to as thermal relief.

The vias 230 depicted in FIG. 2 have a metallic end pad 234 exposed at the first surface 201a of the interposer, and a metallic end pad 235 exposed at the second surface 201b. Pads 234 and 235 are suitable as contact pads for external metallic objects such as pogo pins, copper pillars, and solder connections. Furthermore, one or both ends 234 and 235 of the vias at the first and the second surface may be configured as thermally and electrically conductive horizontal plates suitable to sustain the mechanical pressure of pogo pins of a contactor and the mechanical pressure and thermal stress of attachments to contact pads of PCBs of testers.

The second part 220 of the interposer is operable to control a temperature profile along the vias 230 from the first surface 201a to the second surface 201b including a control of the temperature of the via ends 234 at the first surface 201a.

As FIG. 2 indicates, interposer 200 further has a temperature sensor 240, which is tangent with the first surface 201a of the interposer and monitors the temperature near the via ends 234 at the first surface 201a. The temperature sensor has a sense line vertically extending through the first horizontal interposer part of the interposer so that the temperature can be monitored externally by contacting pad 241, which may be placed at any surface of interposer 200. Connected to the interposer may be an external temperature controller operable to set the required temperature at the via ends 234 at the first surface 201a.

FIG. 3 illustrates another exemplary embodiment of the disclosure, a system, or station, for temperature-controlled testing of packaged semiconductor devices. The station includes a plurality of equipment vertically stacked on top of each other: A tester topped by a printed circuit board (PCB)

302 has a heatable interposer 200 on top of the PCB; a contactor pin block 110 has the bottom of its pogo pins 112 in contact with the interposer and the top of its pogo pins contacting the solder balls 102 of the packaged semiconductor device-to-be-tested 100. The device-to-be-tested is positioned in a temperature-controlled handler 301.

In FIG. 3, the temperature-controlled handler 301 is loaded with the device-to-be-tested 100. The exemplary device may be packaged in a polymeric molding compound 103. The package has metallic leads 101 with solder balls 102. Packaged device 100 is positioned inside the handler 301 so that its leads and solder balls can be contacted from outside.

The station further includes a contactor pin block 110. The contactor pin block includes a plurality of sockets 111 in positions matching the set of leads 101. Consequently, contactor sockets 111 match with respective leads 101 on a one-to-one basis.

Sockets 111 are designed as cavities to hold test pins (pogo pins) 112 in a vertical position. The pogo pins 112 are shaped as elongated cylinders made of hardened metal such as stainless steel, palladium alloy, or metal plated with nickel, palladium, or gold. The pogo pins 112 may have a length of about 3 mm and a diameter of approximately 0.3 mm. On both ends, pogo pins 112 are configured to have crown tips with small teeth or cogs 112a for providing reliable electrical contact to leads 101, solder balls 102, or metallic pads. The number of teeth or points 112a for some pogo pins 112 may vary from 3 to 6. It is convenient that on each end, a pogo pin may protrude a short length for easy contact with a lead, a solder ball, or a pad. In FIG. 3, the teeth of the protrusions at the top end of the pogo pins 112 are in contact with the solder balls 102 of the device package, and the teeth of the protrusions at the bottom end of the pogo pins are in contact with the via pads 234 of the interposer. As FIG. 3 shows, each socket 111 of the exemplary contactor is populated by a pogo pin 112, indicating that each pogo pin is available to, and involved in, testing of the respective lead 101 or solder ball 102 of device package 100.

The first part 210 of the interposer 200 of FIG. 3 includes one or more alternating horizontal layers of thermally conductive material (211) and thermally insulating material (212). The horizontal layers 211 are selected from materials of high thermal conductivity, which are suitable to equalize temperature throughout the volume of the interposer. As examples, layers 211 may be selected from a group of metals including copper, silver, aluminum, gold, zinc, tungsten, molybdenum, and alloys thereof. Alternatively, the layers may be made of configurations and derivatives of carbon, such as carbon nanotubes and graphene.

As FIG. 3 indicates, horizontal layers 211 may have a plurality of thermally conductive vertical interconnections 213 extending from one horizontal layer 211 of thermally conductive material to the adjacent horizontal layers of thermally conductive material. It is the purpose of the thermally conductive horizontal layers 211 and the optional vertical interconnections 213 to create and maintain a uniform distribution of temperature throughout portion 210, in particular a uniform temperature at the first surface 201a.

The second part 220 of the interposer 200 includes one or more controlled heating layers 221, separated by insulating layers 222. Heating layers 221 are controlled by external power and ground supply, indicated by electrical plug 221a. The individual control of the heating layers allows a control of the temperature profile along the vias from the first to the second surface, and a control of the temperature of the contact pads 234 at the via ends exposed at the first surface 201a.

FIG. 3 shows that interposer 200 includes vias 230 extending vertically through the interposer between the first surface 201a and the second surface 201b. As an example, vias 230 may have an electrically conductive core. In another example, depicted by the interposer of FIG. 3, vias 230 exhibit electrically conductive sidewalls 231 surrounding an empty core 232; such vias may be actualized by drilling holes into the insulating material of the interposer and then depositing a metal layer around the sidewalls. In either realization, the electrically conductive core of the vias is insulated by gap 233 from the thermally conductive horizontal layers 211.

Vias 230 have a metallic end pad 234 exposed at the first surface 201a of the interposer, and a metallic end pad 235 exposed at the second surface 201b. Pads 234 and 235 are suitable as contact pads for external metallic objects such as pogo pins, copper pillars, and solder connections. Furthermore, one or both ends 234 and 235 of the vias at the first and the second surface may be configured as thermally and electrically conductive horizontal plates suitable to sustain the mechanical pressure of pogo pins of a contactor and the mechanical pressure and thermal stress of attachments to contact pads of PCBs of testers.

The second part 220 of the interposer is operable to control a temperature profile along the vias 230 from the first surface 201a to the second surface 201b including a control of the temperature of the via ends 234 at the first surface 201a. An external temperature controller is operable to set the required temperature at the exposed via end 234 at the first interposer surface 201a.

As FIG. 3 indicates, interposer 200 further has a temperature sensor 240 tangent with the interposer, which monitors the temperature near the via ends 234 exposed at the first surface 201a and has a sense line extending through the first interposer section. The temperature can be monitored externally by contacting pad 241, which may be placed at any surface of interposer 200.

Via ends 235 exposed at the second surface 201b are operable to contact the pads 335 of the PCB 302 of the tester both electrically and under mechanical pressure. The contacts may be enabled by means of electrically conductive links 310 selected from a group including copper pillars, miniature pogo pins, solder bumps, and conductive adhesives.

While this disclosure has been described in reference to illustrative embodiments, this description is not intended to be construed in a limiting sense. Various modifications and combinations of the illustrative embodiments, as well as other embodiments of the disclosure, will be apparent to persons skilled in the art upon reference to the description. As an example, the disclosure applies to products using any type of semiconductor chip, discrete or integrated circuit, and the material of the semiconductor chip may comprise silicon, silicon germanium, gallium arsenide, gallium nitride, or any other semiconductor or compound material used in integrated circuit manufacturing.

As another example, the disclosure applies not only to flat leads of semiconductor packages, but also to leads configured as cantilevers or pins. As yet another example, the disclosure applies also to package-free semiconductor chips with contact areas.

It is therefore intended that the appended claims encompass any such modifications or embodiment.

We claim:

1. A device comprising:
   a board having a first horizontal part, a second horizontal part, and vias;
   wherein the first horizontal part has a first surface and the second horizontal part has a second surface, and the vias extend vertically between the first surface and the second surface;
   wherein the first part includes alternating horizontal layers of thermally conductive material and thermally insulating material;
   wherein the second part includes heating layers; and
   wherein the vias are electrically conductive and insulated from the thermally conductive horizontal layers, the vias including first ends exposed at the first surface and second ends exposed at the second surface.

2. The device of claim 1 further including thermally conductive vertical interconnections extending from one horizontal layer of thermally conductive material to the adjacent horizontal layers of thermally conductive material.

3. The device of claim 2 wherein the horizontal layers of thermally conductive material and the thermally conductive vertical interconnections each includes a metal selected from a group consisting of copper, silver, aluminum, gold, carbon, zinc, tungsten, molybdenum, and alloys thereof.

4. The device of claim 1 wherein the heating layers of the second part are controlled by an external power and ground supply.

5. The device of claim 4 wherein the heating layers of the second part control a temperature profile along the vias from the first surface to the second surface, and control the temperature of contact pads at the first ends of the vias at the first surface.

6. The device of claim 1 wherein the number of horizontal layers of thermally conductive material is selected to compensate temperature gradients in the first horizontal part of the device.

7. The device of claim 1 wherein the board is usable as a heatable interposer between a contactor and a tester of a semiconductor device test station.

8. The device of claim 7 further including metallic end pads of the vias, a first metallic end pad positioned at the first via end at the first surface and a second metallic end pad positioned at the second via end at the second surface.

9. The device of claim 8 wherein the first metallic end pad and the second metallic end pad of the vias have the mechanical strength and a metallurgical configuration to contact pogo pins of contactors for semiconductor devices, and to contact pads of printed circuit boards (PCB) tied to semiconductor testers.

10. The device of claim 1 further including a temperature sensor tangent with the first surface of the first horizontal part, the sensor having a sense line vertically extending through the first horizontal part.

11. The device of claim 1 wherein at least one of the electrically conductive vias has a core of electrically conductive material.

12. The device of claim 1 wherein at least one of the electrically conductive vias has electrically conductive sidewalls surrounding an empty core.

13. A test station for semiconductor devices, comprising:
    a packaged semiconductor device in a handler at controlled temperature, the device package having metallic leads;
    a contactor having a pin block with sockets containing vertically positioned pogo pins, the top ends of the pogo pins contacting respective metallic leads of the device package, and the bottom ends of the pogo pins protruding from the pin block;
    an interposer comprising a first horizontal part, a second horizontal part, and vias;
    wherein the first horizontal part has a first surface and the second horizontal part has a second surface, and the vias extend vertically between the first surface and the second surface;
    wherein the first part includes alternating horizontal layers of thermally conductive material and thermally insulating material;
    wherein the second part includes heating layers; and
    wherein the vias are electrically conductive and insulated from the thermally conductive horizontal layers, the vias including first ends exposed at the first surface and second ends exposed at the second surface, the first ends of the vias contacted by the bottom ends of respective pogo pins; and
    a printed circuit board (PCB) tied to a tester, the PCB having metallic pads contacting the second via ends of the interposer at the second surface.

14. The test station of claim 13 wherein the contacts between the second via ends of the interposer at the second surface and the respective PCB metallic pads include intermediary links selected from a group including miniature pogo pins, copper pillars, and solder.

15. The test station of claim 13 further including a temperature sensor tangent with the first surface of the interposer, the sensor having a sense line vertically extending through the first horizontal interposer part.

16. The test station of claim 13 wherein at least one of the electrically conductive vias has a core of electrically conductive material.

17. The test station of claim 13 wherein at least one of the electrically conductive vias has electrically conductive sidewalls surrounding an empty core.

18. The test station of claim 13 further including thermally conductive vertical interconnections extending from one horizontal layer of thermally conductive material to the adjacent horizontal layers of thermally conductive material.

19. The test station of claim 18 wherein the horizontal layers of thermally conductive material and the thermally conductive vertical interconnections each includes a metal selected from a group consisting of copper, silver, aluminum, gold, carbon, zinc, tungsten, molybdenum, and alloys thereof.

20. The test station of claim 13 wherein the heating layers of the second part are individually controlled by an external power and ground supply.

21. The test station of claim 20 wherein the heating layers of the second part control a temperature profile along the vias from the first surface to the second surface, and control the temperature of contact pads at the first ends of the vias at the first surface.

22. The test station of claim 13 wherein the number of horizontal layers of thermally conductive material is selected to compensate temperature gradients in the first horizontal part of the device.

23. The test station of claim 13 wherein the board is usable as a heatable interposer between a contactor and a tester of a semiconductor device test station.

24. The test station of claim 23 further including metallic end pads of the vias, a first metallic end pad positioned at the first via end at the first surface and a second metallic end pad positioned at the second via end at the second surface.

25. The device of claim 24 wherein the first metallic end pad and the second metallic end pad of the vias have the mechanical strength and a metallurgical configuration to contact pogo pins of contactors for semiconductor devices, and to contact pads of printed circuit boards (PCB) tied to semiconductor testers.

26. The method of claim 25 further including subjecting the integrated circuit to high-speed alternating current tests.

27. The method of claim 25 wherein at least one of the electrically conductive vias has a core of electrically conductive material.

28. The method of claim 25 wherein at least one of the electrically conductive vias has electrically conductive sidewalls surrounding an empty core.

29. The method of claim 25 further including thermally conductive vertical interconnections extending from one horizontal layer of thermally conductive material to the adjacent horizontal layers of thermally conductive material.

30. The method station of claim 25 wherein the horizontal layers of thermally conductive material and the thermally conductive vertical interconnections each includes a metal selected from a group consisting of copper, silver, aluminum, gold, carbon, zinc, tungsten, molybdenum, and alloys thereof.

31. The method of claim 30 wherein the heating layers of the second part control a temperature profile along the vias from the first surface to the second surface, and control the temperature of contact pads at the first ends of the vias at the first surface.

32. The method of claim 25 wherein the heating layers of the second part are individually controlled by an external power and ground supply.

33. The method of claim 25 wherein the number of horizontal layers of thermally conductive material is selected to compensate temperature gradients in the first horizontal part of the device.

34. The method of claim 33 further including metallic end pads of the vias, a first metallic end pad positioned at the first via end at the first surface and a second metallic end pad positioned at the second via end at the second surface.

35. The method of claim 25 wherein the board is usable as a heatable interposer between a contactor and a tester of a semiconductor device test station.

36. The method of claim 35 wherein the first metallic end pad and the second metallic end pad of the vias have the mechanical strength and a metallurgical configuration to contact pogo pins of contactors for semiconductor devices, and to contact pads of printed circuit hoards (PCB) tied to semiconductor testers.

37. A method for testing a semiconductor device, comprising:
   placing the packaged semiconductor device in a handler at controlled temperature, the device package having metallic leads;
   placing a contactor adjacent the packaged semiconductor device, the contactor having a pin block with sockets containing vertically positioned pogo pins, the top ends of the pogo pins contacting respective metallic leads of the device package, and the bottom ends of the pogo pins protruding from the pin block;
   placing an interposer adjacent the contactor, the interposer comprising a first horizontal part, a second horizontal part, and vias;
      wherein the first horizontal part has a first surface and the second horizontal part has a second surface, and the vias extend vertically between the first surface and the second surface;
      wherein the first part includes alternating horizontal layers of thermally conductive material and thermally insulating material;
      wherein the second part includes heating layers; and
      wherein the vias are electrically conductive and insulated from the thermally conductive horizontal layers, the vias including first ends exposed at the first surface and second ends exposed at the second surface, the first ends of the vias contacted by the bottom ends of respective pogo pins; and
   placing a printed circuit board (PCB) adjacent the interposer, the PCB tied to a tester, the PCB having metallic pads contacting the second via ends of the interposer at the second surface.

38. A semiconductor device tested using the process, comprising:
   placing the packaged semiconductor device in a handler at controlled temperature, the device package having metallic leads;
   placing a contactor adjacent the packaged semiconductor device, the contactor having a pin block with sockets containing vertically positioned pogo pins, the top ends of the pogo pins contacting respective metallic leads of the device package, and the bottom ends of the pogo pins protruding from the pin block;
   placing an interposer adjacent the contactor, the interposer comprising a first horizontal part, a second horizontal part, and vias;
      wherein the first horizontal part has a first surface and the second horizontal part has a second surface, and the vias extend vertically between the first surface and the second surface;
      wherein the first part includes alternating horizontal layers of thermally conductive material and thermally insulating material;
      wherein the second part includes heating layers; and
      wherein the vias are electrically conductive and insulated from the thermally conductive horizontal layers, the vias including first ends exposed at the first surface and second ends exposed at the second surface, the first ends of the vias contacted by the bottom ends of respective pogo pins; and
   placing a printed circuit board (PCB) adjacent the interposer, the PCB tied to a tester, the PCB having metallic pads contacting the second via ends of the interposer at the second surface.

* * * * *